United States Patent
Gillet et al.

(10) Patent No.: US 9,158,953 B2
(45) Date of Patent: Oct. 13, 2015

(54) METHOD AND APPARATUS FOR SCANNING WITH CONTROLLED SPHERICAL ABERRATION

(71) Applicant: Intermec Technologies Corporation, Fort Mill, SC (US)

(72) Inventors: Alain Gillet, Toulouse (FR); Vincent Bessettes, Toulouse (FR)

(73) Assignee: Intermec Technologies Corproation, Fort Mill, SC (US)

( * ) Notice: Subject to any disclaimer, the term of this patent is extended or adjusted under 35 U.S.C. 154(b) by 0 days.

(21) Appl. No.: 14/181,550

(22) Filed: Feb. 14, 2014

(65) Prior Publication Data

US 2015/0235068 A1    Aug. 20, 2015

(51) Int. Cl.
  *G06K 7/10*      (2006.01)
  *G06K 7/14*      (2006.01)
  *H01L 27/146*    (2006.01)

(52) U.S. Cl.
  CPC .......... *G06K 7/10801* (2013.01); *G06K 7/1413* (2013.01); *G06K 7/1417* (2013.01); *G06K 7/1439* (2013.01); *H01L 27/14625* (2013.01)

(58) Field of Classification Search
  CPC ............... G06T 5/003; G06T 1/0064; G06T 2201/0052; G06T 2207/10024; G06T 2207/20201; G06T 1/0021; G06T 2201/005; G06T 3/0056; G06T 3/0068; G06T 11/60; G06T 1/0007; G06T 2200/28; G06K 7/10801; G06K 7/1413; G06K 7/1417; G06K 7/1439; G06K 5/00; G06K 7/10821; G06K 7/14; G06K 7/1443; G06K 7/1447; G06K 7/1473

USPC ............ 235/436, 454, 462.15, 462.1, 462.11
See application file for complete search history.

(56) References Cited

U.S. PATENT DOCUMENTS

| | | | |
|---|---|---|---|
| 5,936,224 A * | 8/1999 | Shimizu et al. | 235/462.1 |
| 6,547,139 B1 * | 4/2003 | Havens et al. | 235/454 |
| 7,224,540 B2 * | 5/2007 | Olmstead et al. | 359/754 |
| 8,265,404 B2 * | 9/2012 | Nunnink et al. | 382/233 |
| 8,596,541 B2 * | 12/2013 | Chiu et al. | 235/462.31 |
| 8,750,637 B2 * | 6/2014 | Strom et al. | 382/255 |
| 2007/0268592 A1 * | 11/2007 | Kam et al. | 359/637 |
| 2012/0018518 A1 | 1/2012 | Strom et al. | |
| 2012/0087551 A1 | 4/2012 | Bhagwan et al. | |
| 2012/0091204 A1 | 4/2012 | Shi | |

OTHER PUBLICATIONS

Extended Search Report in Related European Application No. 15153143.1, dated Jul. 10, 2015, 6 pages.

* cited by examiner

*Primary Examiner* — Seung Lee
(74) *Attorney, Agent, or Firm* — Additon, Higgins & Pendleton, P.A.

(57) ABSTRACT

A reader obtains image data corresponding to an image of optically encoded information that is received via a lens unit that causes controlled spherical aberration blurring that is precisely known. The reader may perform deconvolution processing on the image data to render it decodable. The deconvolution processing may implement a Weiner filter that uses data corresponding to a near-field point spread function of the lens unit. The depth of field of the reader is greater than that of conventional reader in all lighting conditions.

50 Claims, 10 Drawing Sheets

METHOD AND APPARATUS FOR SCANNING WITH CONTROLLED SPHERICAL ABERRATION

BACKGROUND

1. Technical Field

The present disclosure generally relates to the field of imaging, and, more particularly, imaging using controlled spherical aberration blurring.

2. Description of the Related Art

Imaging systems have an inherent limit in the ability to remain focused over long distances. The depth of field (DOF) of a reader is the distance between the nearest and farthest objects in a scene that appear acceptably sharp in an image. If a reader is used to decode optically encoded information (e.g., a barcode), increasing the DOF of the reader increases the zone in which the reader can reliably decode the encoded information.

Conventional techniques for extending the DOF of readers include physically moving lenses of the readers. Providing readers with movable lenses can increase the costs of manufacturing and maintaining such readers. Accordingly, it may be desirable to increase the DOF of readers in any lighting condition, including daylight, without employing movable lenses.

BRIEF SUMMARY

A method of decoding optically encoded information performed by an image processing system may be summarized as including: obtaining first image data corresponding to an image of optically encoded information received via a lens unit that causes controlled spherical aberration; performing first processing on the first image data; responsive to the first processing on the first image data not producing data corresponding to the optically encoded information, obtaining second image data by performing second processing on the first image data and performing the first processing on the second image data; and responsive to the first processing on the second image data not producing the data corresponding to the optically encoded information, obtaining third image data by performing third processing on the first image data and performing the first processing on the third image data.

The lens unit may cause predetermined spherical aberration blurring in the image of the optically encoded information. The second processing may include deconvolution processing. The second processing may include Weiner filter deconvolution processing. The Weiner filter deconvolution processing may be performed using data corresponding to a point spread function of the lens unit. The Weiner filter deconvolution processing may be performed using data corresponding to a near-field point spread function of the lens unit. The Weiner filter deconvolution processing may be performed using a one-dimensional deconvolution kernel. The third processing may include deconvolution processing. The third processing may include Weiner filter deconvolution processing. The Weiner filter deconvolution processing may be performed using data corresponding to a point spread function of the lens unit. The Weiner filter deconvolution processing may be performed using data corresponding to a near-field point spread function of the lens unit. The Weiner filter deconvolution processing may be performed using two one-dimensional deconvolution kernels. The Weiner filter deconvolution processing may be performed using a first deconvolution kernel matrix and a second deconvolution kernel matrix that is orthogonal to the first deconvolution kernel matrix. The second deconvolution kernel matrix may correspond to the first deconvolution kernel matrix rotated by ninety degrees. The optically encoded information may include a one-dimensional barcode symbol. The optically encoded information may include a two-dimensional machine-readable symbol. The lens unit may cause more near-field spherical aberration blurring than far-field spherical aberration blurring. The lens unit may produce spherical aberration blurring such that offsetting fifth order effects are added to third order solutions to a spherical aberration equation. The method may further include outputting the data corresponding to the optically encoded information.

An image processing system may be summarized as including: one or more processors; and one or more processor-readable storage media storing processor-executable instructions that, when executed by the one or more processors, causes the one or more processors to: obtain first image data corresponding to an image of optically encoded information received via a lens unit that causes controlled spherical aberration; perform first processing on the first image data; responsive to the first processing on the first image data not producing data corresponding to the optically encoded information, perform second processing on the first image data to obtain second image data and perform the first processing on the second image data; and responsive to the first processing on the second image data not producing the data corresponding to the optically encoded information, perform third processing on the first image data to obtain third image data and perform the first processing on the third image data.

The lens unit may cause predetermined spherical aberration blurring in the image of the optically encoded information. The second processing may include deconvolution processing. The second processing may include Weiner filter deconvolution processing. The Weiner filter deconvolution processing may be performed using data corresponding to a point spread function of the lens unit. The Weiner filter deconvolution processing may be performed using data corresponding to a near-field point spread function of the lens unit. The Weiner filter deconvolution processing may be performed using a one-dimensional deconvolution kernel. The third processing may include deconvolution processing. The third processing may include Weiner filter deconvolution processing. The Weiner filter deconvolution processing may be performed using data corresponding to a point spread function of the lens unit. The Weiner filter deconvolution processing may be performed using data corresponding to a near-field point spread function of the lens unit. The Weiner filter deconvolution processing may be performed using two one-dimensional deconvolution kernels. The Weiner filter deconvolution processing may be performed using a first deconvolution kernel matrix and a second deconvolution kernel matrix that is orthogonal to the first deconvolution kernel matrix. The second deconvolution kernel matrix may correspond to the first deconvolution kernel matrix rotated by ninety degrees. The optically encoded information may include a one-dimensional barcode symbol. The optically encoded information may include a two-dimensional machine-readable symbol. The lens unit may cause more near-field spherical aberration blurring than far-field spherical aberration blurring. The image processing system may further include the lens unit. The lens unit may produce spherical aberration blurring such that offsetting fifth order effects are added to third order solutions to a spherical aberration equation.

An imager may be summarized as including: a lens unit that produces predetermined spherical aberration blurring, the lens unit producing spherical aberration blurring such that offsetting fifth order effects are added to the third order solutions to a spherical aberration equation; and an image sensor that obtains images through the lens unit and produces corresponding image data.

The lens unit may include a first lens, a second lens, a third lens, and a diaphragm disposed between the first lens and the second lens. The first lens may be a biconvex lens, the second lens may be a convex-concave lens, and the third lens may be a biconvex lens. The imager may further include an aimer that produces a visible marker. The imager may further include a light source that produces light. The imager may further include a controller that controls operation of the image sensor, the aimer, and the light source. Respective points of an optical field entering the lens unit that are offset by respective angles from an optical axis of the lens unit may converge in respective regions of an image plane of the image sensor.

An imager may be summarized as including: a lens unit that produces predetermined spherical aberration blurring, the lens unit producing spherical aberration blurring with third order solutions to a spherical aberration equation; an image sensor that obtains images through the lens unit and produces corresponding image data; and one or more processors; and one or more processor-readable storage media storing processor-executable instructions that, when executed by the one or more processors, cause the one or more processors to: obtain first image data corresponding to an image of optically encoded information received via the lens unit; perform first processing on the first image data; responsive to the first processing on the first image data not producing data corresponding to the optically encoded information, perform second processing on the first image data to obtain second image data and perform the first processing on the second image data.

The lens unit may include a first lens, a second lens, a third lens, and a diaphragm disposed between the first lens and the second lens. The first lens may be a biconvex lens, the second lens may be a convex-concave lens, and the third lens may be a biconvex lens. The imager may further include an aimer that produces a visible marker. The imager may further include a light source that produces light. The imager may further include a controller that controls operation of the image sensor, the aimer, and the light source. Respective points of an optical field entering the lens unit that are offset by respective angles from an optical axis of the lens unit may converge in respective regions of an image plane of the image sensor.

DETAILED DESCRIPTION

Machine-readable symbols such as one-dimensional barcode symbols can be characterized by its minimum symbol spacing or X dimension. Conventional readers may not be capable of decoding barcode symbols having X dimensions that are less than 6 mils. Readers according to the present disclosure have about twice the depth of field compared to conventional readers and are capable of decoding barcode symbols having X dimensions that are less than 4 mils.

A reader according to the present disclosure includes a lens unit that causes controlled spherical aberration blurring in the near field and in the far field that is precisely known. The imager includes a processor that can perform deconvolution image processing to render images of barcode symbols decodable. The processor performs the deconvolution image processing on some or all images depending on performance. For example, the processor attempts to decode image data corresponding to an image of a machine-readable symbol (e.g., a one-dimensional barcode symbol or two-dimensional area as matrix or stacked code symbol). If the image data cannot be decoded, the processor performs the deconvolution image processing on the image data and then attempts to decode the processed image data.

Figure 1:
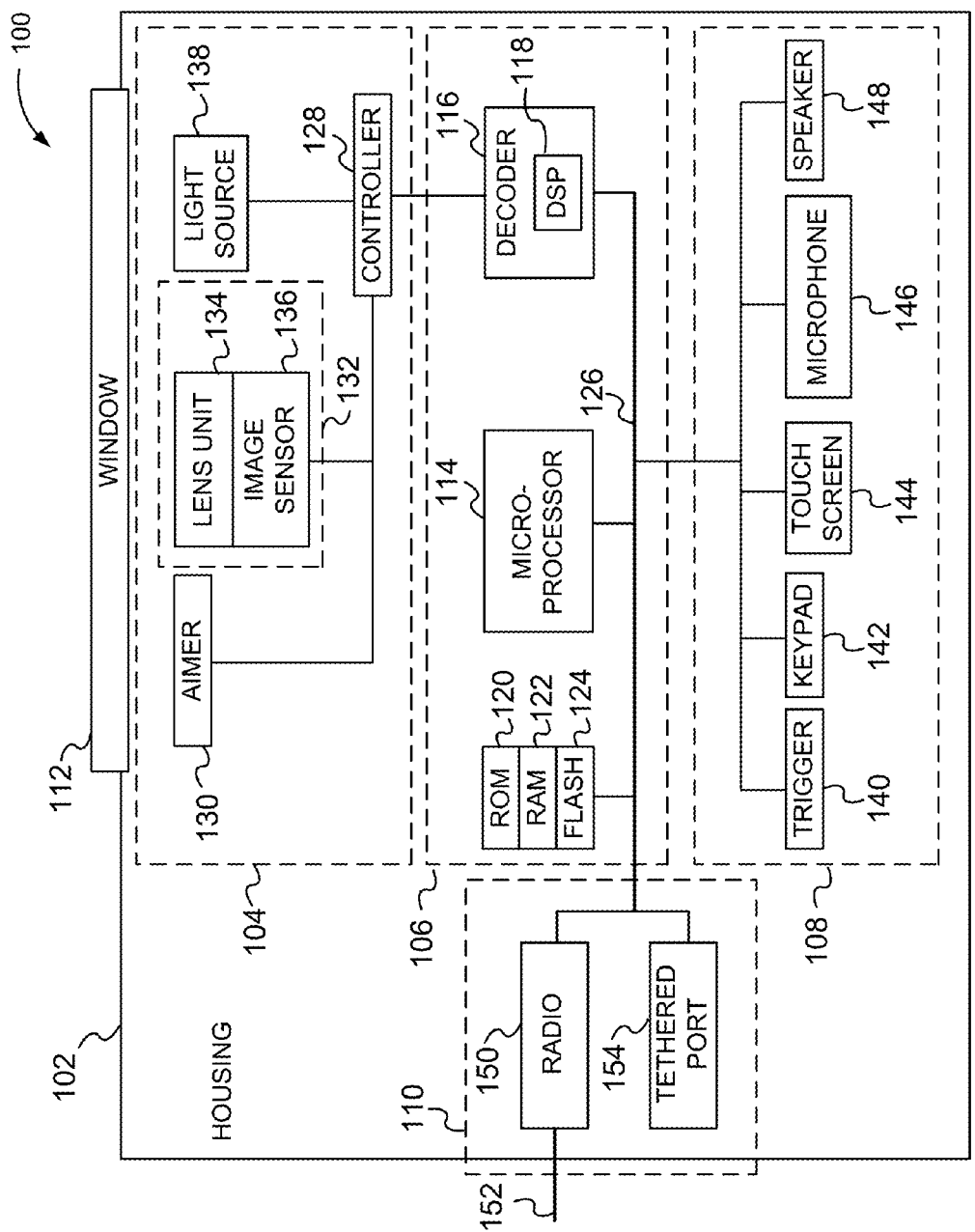
FIG. 1 is a block diagram of a reader, according to at least one illustrated embodiment.

FIG. 1 shows a machine-readable symbol reader system 100 according to at least one illustrated embodiment. The reader 100 includes a housing 102, an imager 104, a control subsystem 106, a user interface 108, and a communications subsystem 110. The housing 102 houses various components and may take any of a variety of forms, and may have any of a large variety of shapes. For example, the housing may have a handheld form factor, for instance, in the shape of a pistol or a rectangular box. Alternatively, the housing may have a fixed form factor, maintained at a fixed location—for example a point of sale location in a retail environment. The housing 102 includes a translucent portion or window 112.

The control subsystem 106 may include one or more controllers for controlling operation of the reader 100, for instance, processors such as microprocessors 114, a decoder 116 including one or more digital signal processors (DSPs) 118, graphical processing units (GPUs) (not shown), application specific integrated circuits (ASICs) (not shown), programmable gate arrays (PGAs) (not shown), programmable logic controllers (PLCs) (not shown), a non-transitory computer- or processor-readable devices (e.g., read only memory (ROM), random access memory (RAM), and/or flash memory, or other forms of static or dynamic memory).

Additionally, the control subsystem 106 also may include one or more non-transitory computer- or processor-readable devices, for instance, one or more memories such as read only memory (ROM) 120, random access memory (RAM) 122, and/or flash memory 124, or other forms of static or dynamic memory. While not illustrated, the control subsystem 106 may include other non-transitory media, for instance, spinning media such as a magnetic hard disk and hard disk drive (not shown) and/or optical disk and optical disk drive (not shown). The microprocessor(s) 114, GPUs, DSPs 118, ROM 120, RAM 122, flash memory 124, and/or other components are communicatively coupled via one or more communicative paths, for instance, one or more buses (only one illustrated) 126. The buses 126 may, for example, include a power bus, instruction bus, data bus, address bus, etc.

The imager 104 includes a controller 128 that is communicatively coupled to the decoder 116. The controller 128 provides electrical signals that are used to control various components of the imager 104. The image 104 may optionally include an aimer 130 that emits a visible pointer through the window 112. The visible pointer emitted by the aimer 130 indicates to an operator where an imaging unit 132 is pointing. The aimer 130 may include a Class 2, 650 nm laser, for example. The imaging unit 132 includes a spherical aberration lens unit 134 and an image sensor 136. The imager 104 also may include a light source 138, which is communicatively coupled to and controlled by the controller 128. The light source 138 may include, for example, one or more white light emitting diodes (LEDs).

Light enters the imager 104 through the window 112 of the reader 100. The spherical aberration lens unit 134 modulates the light and causes controlled spherical aberration blurring, as will be explained in detail below. The light that is modulated by the spherical aberration lens unit 134 strikes an image plane of the image sensor 136, which includes a two-dimensional array of light detectors or sensors elements. Each of the sensors elements produces an electrical signal that is proportional to the intensity of light incident thereon. The image sensor 136 may include a charge coupled device (CCD) or an active pixel sensor formed using complementary metal-oxide-semiconductor (CMOS) technology, for example.

The image sensor 136 may include a plurality of amplifiers that amplify the signals produced by the light detectors. The image sensor 136 also may include a plurality of analog-to-digital converters that convert electrical signals output by the light detectors (or amplifiers) into corresponding digital values. The image sensor 136 may aggregate the output of the analog-to-digital converters into an image file having a particular format (e.g., RAW, TIFF, or JPEG). The image file generated by the image sensor 136 includes digital image data that corresponds to an image formed on the image plane of the image sensor 136. The controller 128 causes the image sensor 136 to output the image file to the decoder 116.

The decoder 116 processes the image data received from the image sensor 136 and attempts to decode one or more symbols included in the image data. More particularly, the decoder 116 causes the DSP(s) 118 to process the image data using algorithms known to those skilled in the art for decoding one or more one-dimensional or two dimensional symbologies (e.g., barcode symbologies). In one embodiment, the decoder 116 is a model ED40 decode board from Intermec by Honeywell Scanning and Mobility, as modified to perform the deconvolution image processing according to the present disclosure.

The user interface 108 may be communicatively coupled to, and controlled by, the microprocessor 114 via the bus 126. The user interface 108 may comprise a number of user input and/or user output components. For example, the user interface 108 may include a trigger switch 140, a keypad 142, keys, other switches, buttons, a touch screen 144 with user selectable icons, trackpad, trackball, joy or thumbstick and/or microphone 146 as user input devices. Also, for example, the user interface may include a display, lights, speaker(s) 148, and/or tactile or vibratory transducer as user output devices.

The communications subsystem 110 also may be communicatively coupled to, and controlled by, the microprocessor 114 via the bus 126. The communications subsystem 110 enables communications with devices, systems and/or networks external to the reader 100. The communications subsystem 110 may include one or more transmitters, receivers or transceivers (collectively radios 150) that enable wireless communications. For example, the reader 100 may include radios 150 (only one shown) and associated antennas 152 (only one shown) for wireless communications via various communications standards and/or protocols, for instance, Bluetooth, WiFi, or cellular. The communications subsystem 110 may include one or more tethered ports 152 (only one shown) to enable wired or optical (collectively tethered) communications. For example, communications via various communications standards and/or protocols, for instance, USB, Ethernet, FireWire, or Thunderbolt standards and protocols. The radio(s) 150 and tethered port(s) 152 may be communicatively coupled to the bus 126.

For example, when an operator of the reader 100 actuates the trigger switch 140 of the user interface 108, a signal is sent to the microprocessor 114, which instructs the decoder 116 to send a control signal to the controller 128 of the imager 104. The controller 128 then causes the light source 138 and the aimer 130 to produce light and a laser beam, respectively, which are emitted through the window 112. The laser beam produced by the aimer 130 may cause a visible marker to appear on the surface of a barcode symbol, which helps the operator aim the reader 100 at the barcode symbol so that the image sensor 136 can acquire image data corresponding to the barcode symbol for decoding. Light reflected from the barcode symbol enters the housing 102 through the window 112, is modulated by the spherical aberration lens unit 134, and forms an image on an image plane of the image sensor 136. The controller 128 causes the image sensor 136 to produce corresponding image data and provide the image data to the decoder 116. After the decoder 116 decodes the symbols contained in the image data, the decoder 116 provides information corresponding to the decoded symbols to the microprocessor 114. The microprocessor 110 may cause the speaker 148 to produce an audible alert, and cause the touch screen 144 to display the information. Optionally, the microprocessor 114 may perform additional manipulation or processing on the decoded information, for example, transmitting such via the radio(s) 150 and/or tethered port(s) 152.

Figure 2:
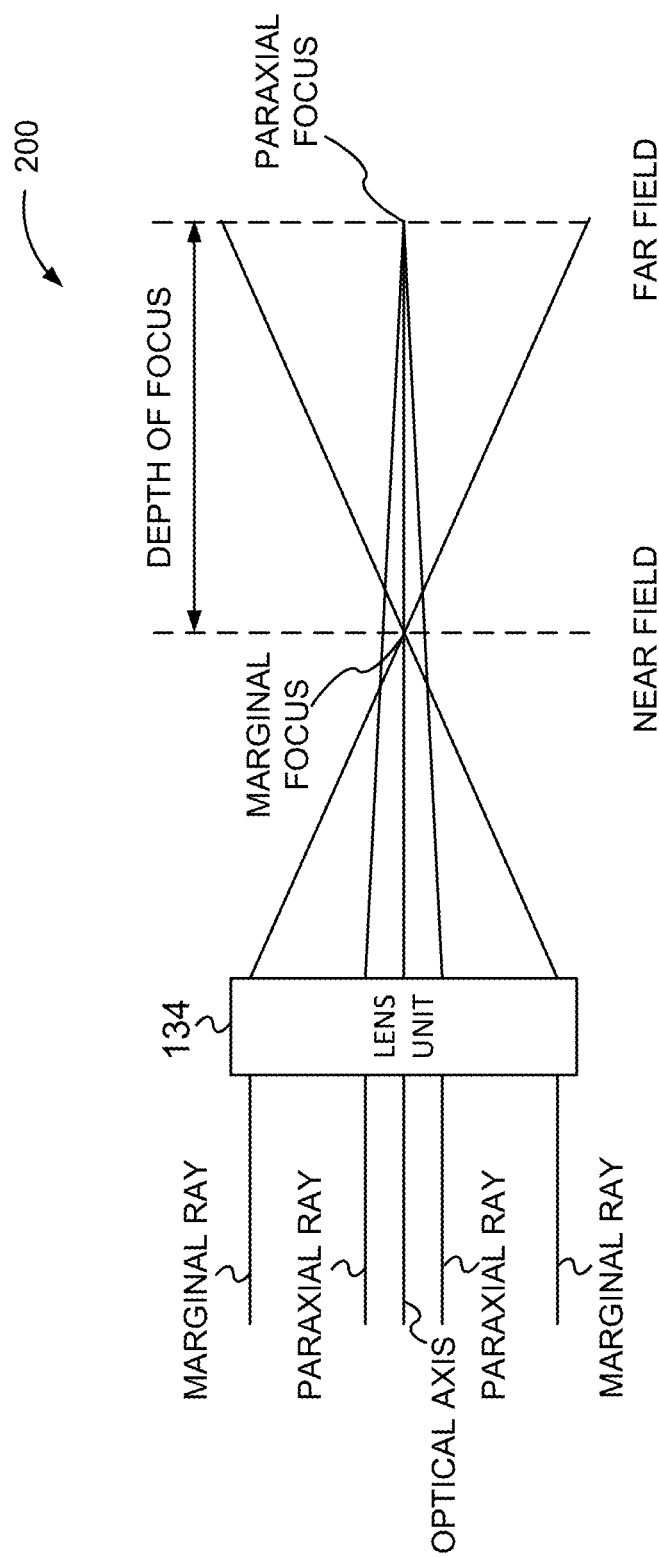
FIG. 2 is a simplified model for explaining the spherical aberration blurring caused by the reader shown in FIG. 1, according to at least one illustrated embodiment.

FIG. 2 shows a simplified model 200 for explaining the spherical aberration blurring caused by the lens unit 134 shown in FIG. 1. Marginal light rays that enter the spherical aberration lens unit 134 relatively far from the optical axis are focused on the optical axis at a marginal focus point. Paraxial light rays that enter the spherical aberration lens unit 134 relatively close to the optical axis are focused on the optical axis at a paraxial focus point. Accordingly, instead of a single point of focus, there are several points of focus along the optical axis of the spherical aberration lens unit 134. The distance along the optical axis between the marginal focus point and the paraxial focus point is the usable depth of focus of the spherical aberration lens unit 134.

As shown in FIG. 2, the spherical aberration lens unit 134 focuses light very well near the paraxial focus point, which corresponds to the far field of the lens unit 134. The spherical aberration lens unit 134 does not focus light as well near the marginal focus point, which corresponds to the near field of the lens unit 134. The degree of spherical aberration blurring in the mid-field is greater than the degree of spherical aberration blurring in the far field, and is less than the degree of spherical aberration blurring in the near field. The spherical aberration lens unit 134 creates a uniformly blurred image throughout the DOF.

Figure 3:
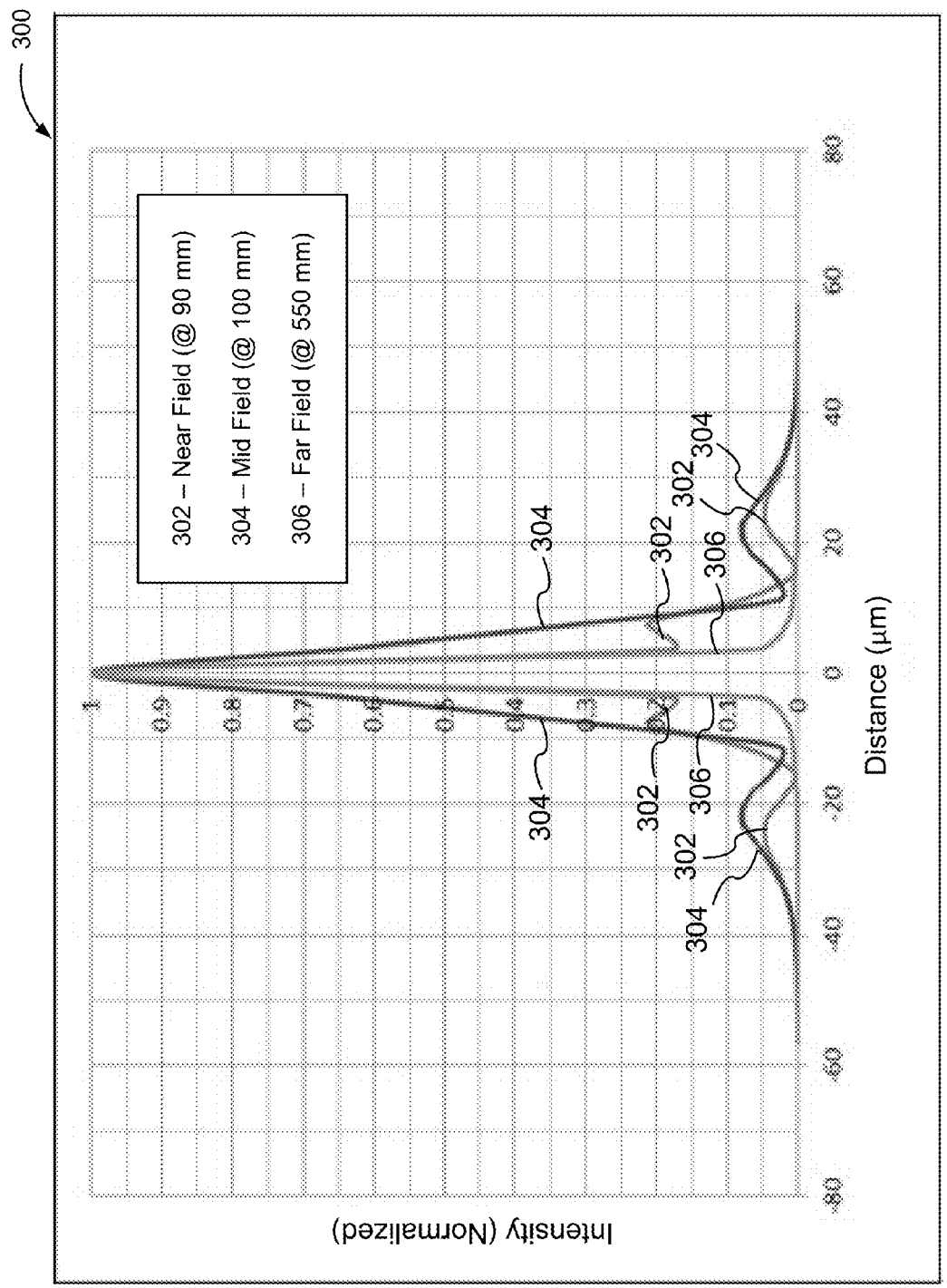
FIG. 3 is a chart showing graphs of point spread functions of the reader shown in FIG. 1, according to at least one illustrated embodiment.

FIG. 3 shows relative degrees of focus produced by the spherical aberration lens unit 134 at various distances from the spherical aberration lens unit 134. More particularly, FIG. 3 shows a chart 300 including a graph of a near-field Point Spread Function (PSF) 302, a graph of a mid-field PSF 304, and a graph of a far-field PSF 306 of the spherical aberration lens unit 134. The near-field PSF 302 shows the relative degree of focus of a point that is at a distance of 90 millimeters (mm) from the window 112. The mid-field PSF 304 shows the relative degree of focus of a point that is at a distance of 100 mm from the window 112. The far-field PSF 306 shows the relative degree of focus of a point that is at a distance of 550 mm from the window 112.

The far-field PSF 306 has the shape of an ideal Gaussian curve and is indicative of very good focus. The spherical aberration lens unit 134 causes increased blurring of points closer than 550 mm from the lens unit 134. More particularly, the side lobes of the near-field PSF 302 and the mid-field PSF 304 have the effect of blurring the focus of points closer than 550 mm from the lens unit 134. In one embodiment, the near field is located approximately 8-12 centimeters (cm) from the window 112, the near mid field is located approximately 15-20 cm from the window 112, and the far field is located farther than approximately 30 cm from the window 112.

Figure 4B:
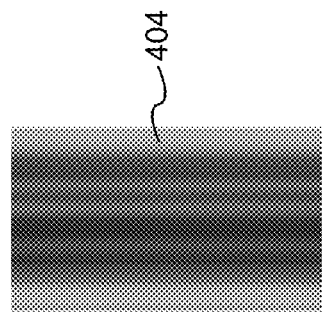
FIG. 4B is a hypothetical image of the barcode symbol of FIG. 4A as imaged by the reader shown in FIG. 1.
Figure 4A:
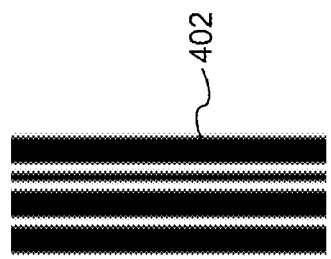
FIG. 4A is a hypothetical barcode symbol.

FIG. 4A shows an example of a barcode symbol 402. FIG. 4B shows an example of an image 404 of the barcode symbol 402, as imaged by the reader 100. As shown in FIG. 4B, the image 404 of the barcode symbol 402 appears blurred to the naked eye. Due to the side lobes of the near-field PSF 302 and the mid-field PSF 304, the blurring produced by the lens unit 134 is different from that of a conventional lens which is out of focus. The side lobes of the near-field PSF 302 and the mid-field PSF 304 may produce spherical aberration blurring that causes a wide bar in the barcode symbol 402 to be mistaken for a narrow bar. For example, the first bar on the left side of the barcode symbol 402 is fairly wide, however, it appears to be fairly narrow in the image 404 of the barcode symbol 402.

The image 404 of the barcode symbol 402 can be corrected by performing deconvolution image processing on image data corresponding to the image 404 because the nature of the blurring and the PSF of the lens unit 134 are known. For example, the deconvolution processing can implement a Wiener filter to remove noise (i.e., spherical aberration blurring) from the image 404. Equation 1 shows an equation corresponding to the Wiener filter, where N(f) is the noise power level and S(f) is the signal power level. The ratio of N(f) to S(f) can be estimated. For example, a predetermined value corresponding to the ratio of N(f) to S(f) may be stored by the decoder 116. H(f) is obtained by taking a Fourier transform of data corresponding to the near-field PSF 302 of the lens unit 134. An inverse Fourier transform of G(f) is approximately equal to a deblurred PSF. Deblurred image data can be obtained by performing image processing that convolves data corresponding to the deblurred PSF with data corresponding to the blurred image.

$$G(f) = \frac{1}{H(f)} \left[ \frac{|H(f)|^2}{|H(f)|^2 + \frac{N(f)}{S(f)}} \right] \quad \text{(Equation 1)}$$

Figure 5B:
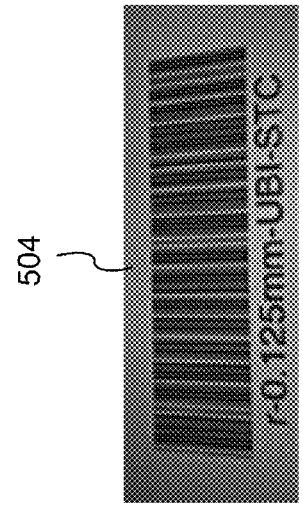
FIG. 5B is an image corresponding to the image of the barcode symbol of FIG. 5A as deblurred by the reader shown in FIG. 1, according to at least one illustrated embodiment.
Figure 5A:
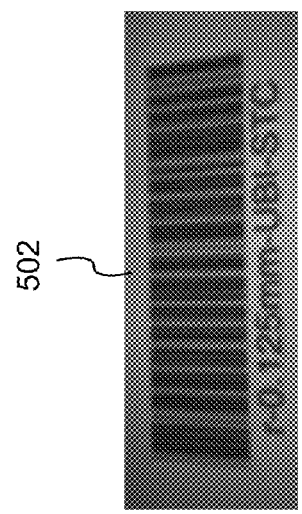
FIG. 5A is an image of a barcode symbol as imaged by the reader shown in FIG. 1, according to at least one illustrated embodiment.

FIG. 5A shows an example of a blurred image 502 of a barcode symbol, as imaged by the reader 100. FIG. 5B shows an example of a deblurred image 504 corresponding to the blurred image 502. That is, the reader 100 performs deconvolution image processing that implements Equation 1 on image data corresponding to the blurred image 502 to generate image data corresponding to the deblurred image 504. Such image processing can be performed using a software program written in the C programming language that uses the Wiener filter deconvolution function deconvwnr provided by MATLAB from MathWorks, for example. The deconvwnr function can deconvolve an image using the Wiener filter algorithm and return a deblurred image. For example, the deconvwnr function can return an N-dimensional array containing deblurred image data after being invoked with input parameters including an N-dimensional array containing deblurred image data, an M-dimensional array containing a deconvolution kernel corresponding to the near-field PSF 302 of the image unit 134, and a scalar value corresponding to an estimated noise-to-signal ratio. In one embodiment, the deconvolution kernel is a 9-by-9 matrix.

Conventional spherical aberration lenses typically utilize only first or third order solutions to a spherical aberration equation. The lens unit 134 is designed to have nearly uniform blurring over a large distance. To achieve such uniform blurring, the lens unit 134 was designed using Zemax Optical and Illumination Design software from Radiant Zemax, which performs a ray tracing and optimization procedures.

Figure 6A:
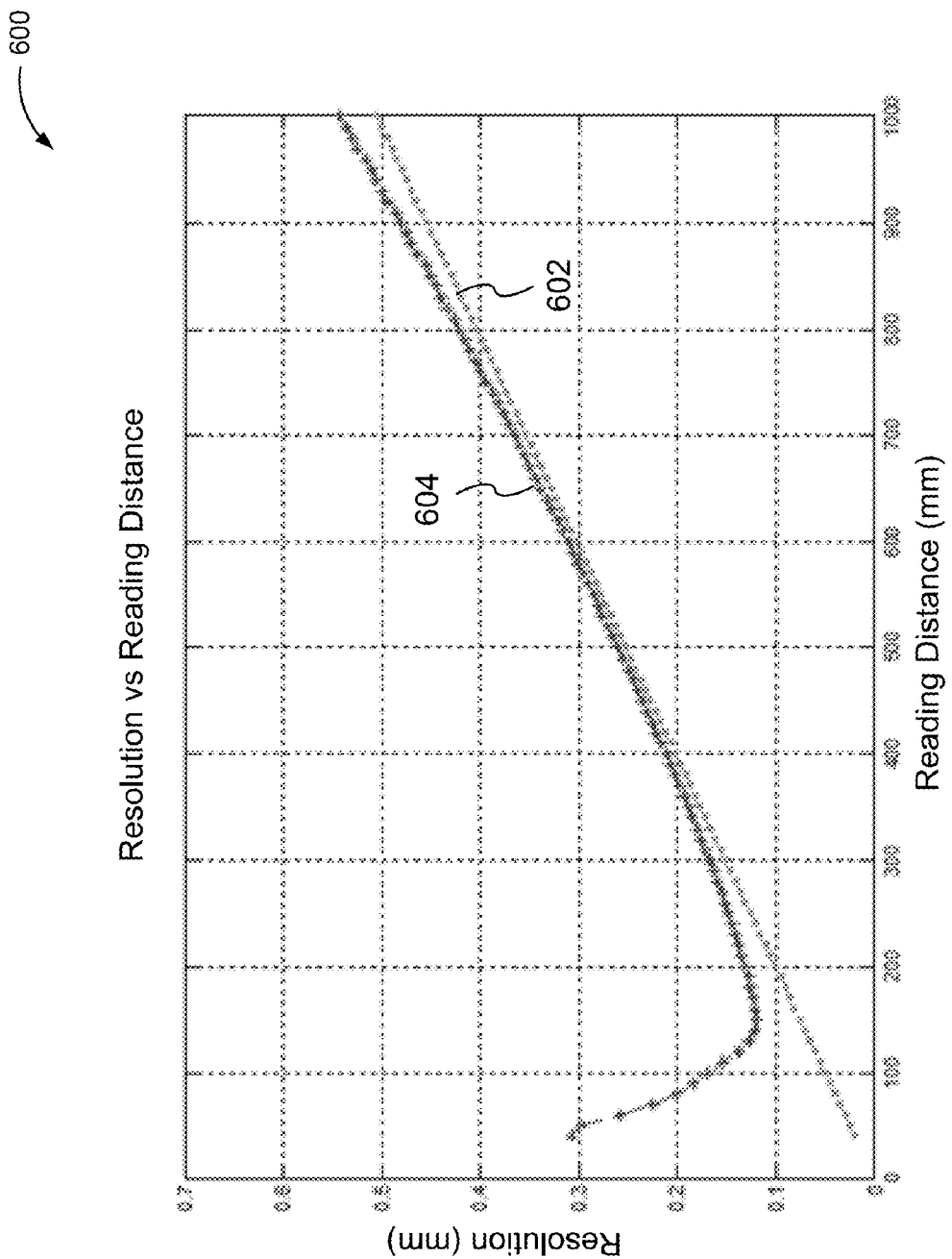
FIG. 6A is a chart showing graphs of performance characteristics of the reader shown in FIG. 1, according to at least one illustrated embodiment.

FIG. 6A is a chart 600 showing resolution as a function of reading distance (i.e., the distance from the window 112) for the imaging unit 132, according to one illustrated embodiment. The chart 600 includes a graph 602 that corresponds to theoretical or desired resolution as a function of reading distance of the imaging unit 132. The chart 600 also includes a graph 604 that corresponds to simulated resolution as a function of reading distance of the imaging unit 132. The graph 604 was obtained by adding offsetting fifth-order effects to the third order solution of the spherical aberration equation. The graph 604 is based on the imaging unit 132 having a focal length f=5.6, an f-number N=5.6, a best focus parameter x=256, a third-order spherical aberration parameter Sa3=−1.21 micrometers (μm), and a fifth-order spherical aberration parameter Sa5=1.94 μm; and the image sensor 136 having one million light detectors or sensor elements, wherein each sensor element has a size of 3 μm. As shown in FIG. 6A, the graph 604 for the simulated spherical aberration blurring of the imaging unit 132 closely approximates the graph 602 for the desired spherical aberration blurring of the imaging unit 132. Additionally, the graph 604 for the simulated spherical aberration blurring of the imaging unit 132 shows a smooth transition between the near field to the far field of the imaging unit 132.

Figure 6B:
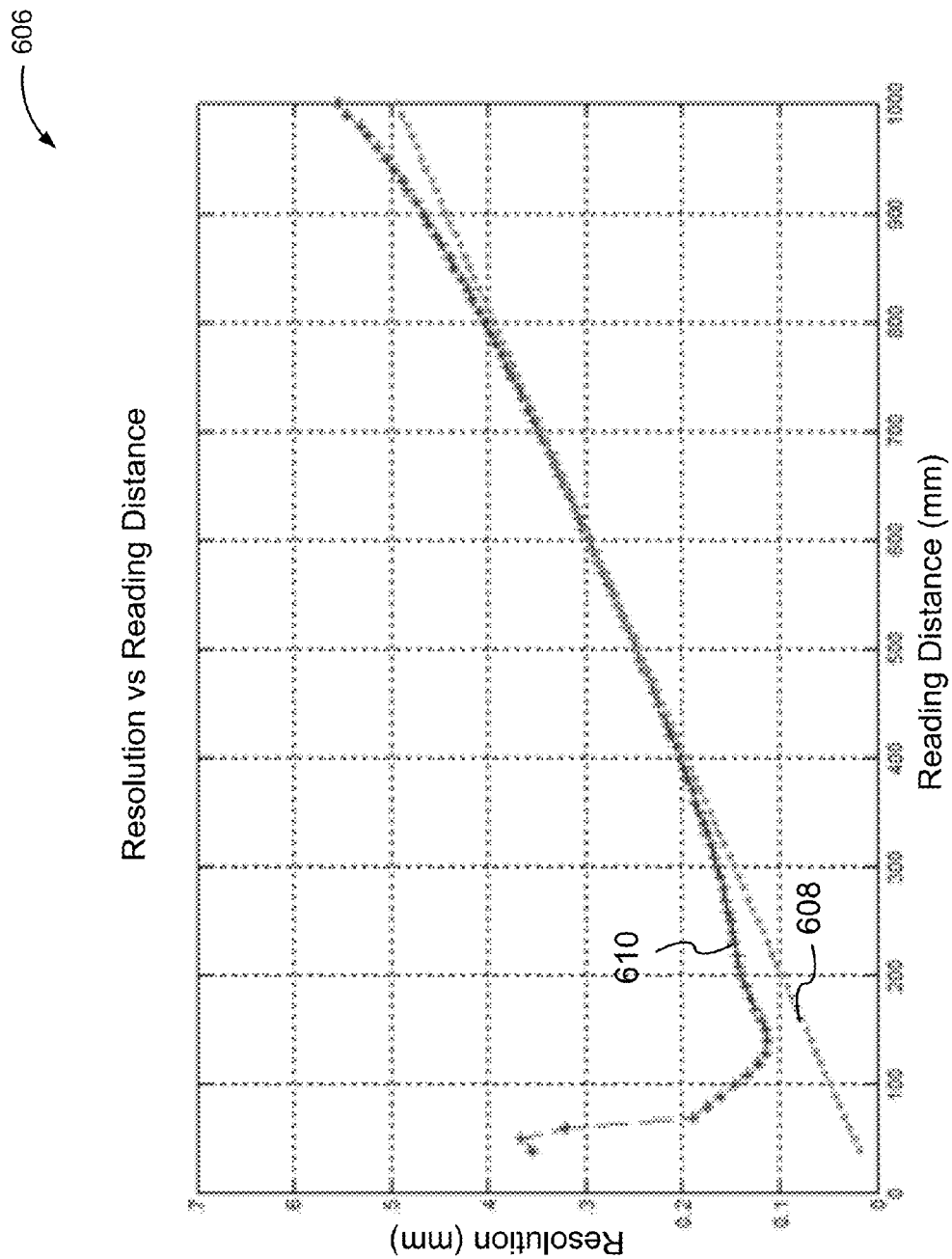
FIG. 6B is a chart showing graphs performance characteristics of the reader shown in FIG. 1, according to at least one illustrated embodiment.

FIG. 6B is a chart 606 showing resolution as a function of reading distance (i.e., the distance from the window 112) for the imaging unit 132, according to one illustrated embodiment. The chart 606 includes a graph 608 that corresponds to theoretical or desired spherical aberration blurring of the imaging unit 132. The chart 606 also includes a graph 610 that corresponds to simulated spherical aberration blurring of the imaging unit 132. The graph 610 was obtained using the third order solution of the spherical aberration equation, without using the offsetting fifth-order effects used to generate the graph 604 shown in FIG. 6A. The graph 610 is based on the imaging unit 132 having a focal length f=5.6, an f-number N=5.143 a best focus parameter x=125, a third-order spherical aberration parameter Sa=1.78 µm; and the image sensor 136 having one million light detectors or sensor elements, wherein each sensor element has a size of 3 µm.

As shown in FIGS. 6A and 6B, the graph 604 more closely approximates the desired resolution indicated by the graph 602 than the graph 610 approximates the desired resolution indicated by the graph 608. Additionally, the graph 604 shows that acceptable reading performance drops off at 50 mm, while the graph 610 shows that acceptable reading performance drops off at 70 mm. In addition, the DOF of a lens unit corresponding to the graph 604 is near double the DOF of a lens unit corresponding to the graph 610. Accordingly, a lens unit that produces spherical aberration blurring by adding offsetting fifth-order effects to the third order solution of the spherical aberration equation has far better performance compared to a lens unit that produces spherical aberration blurring using only the third order solution of the spherical aberration equation.

Figure 7:
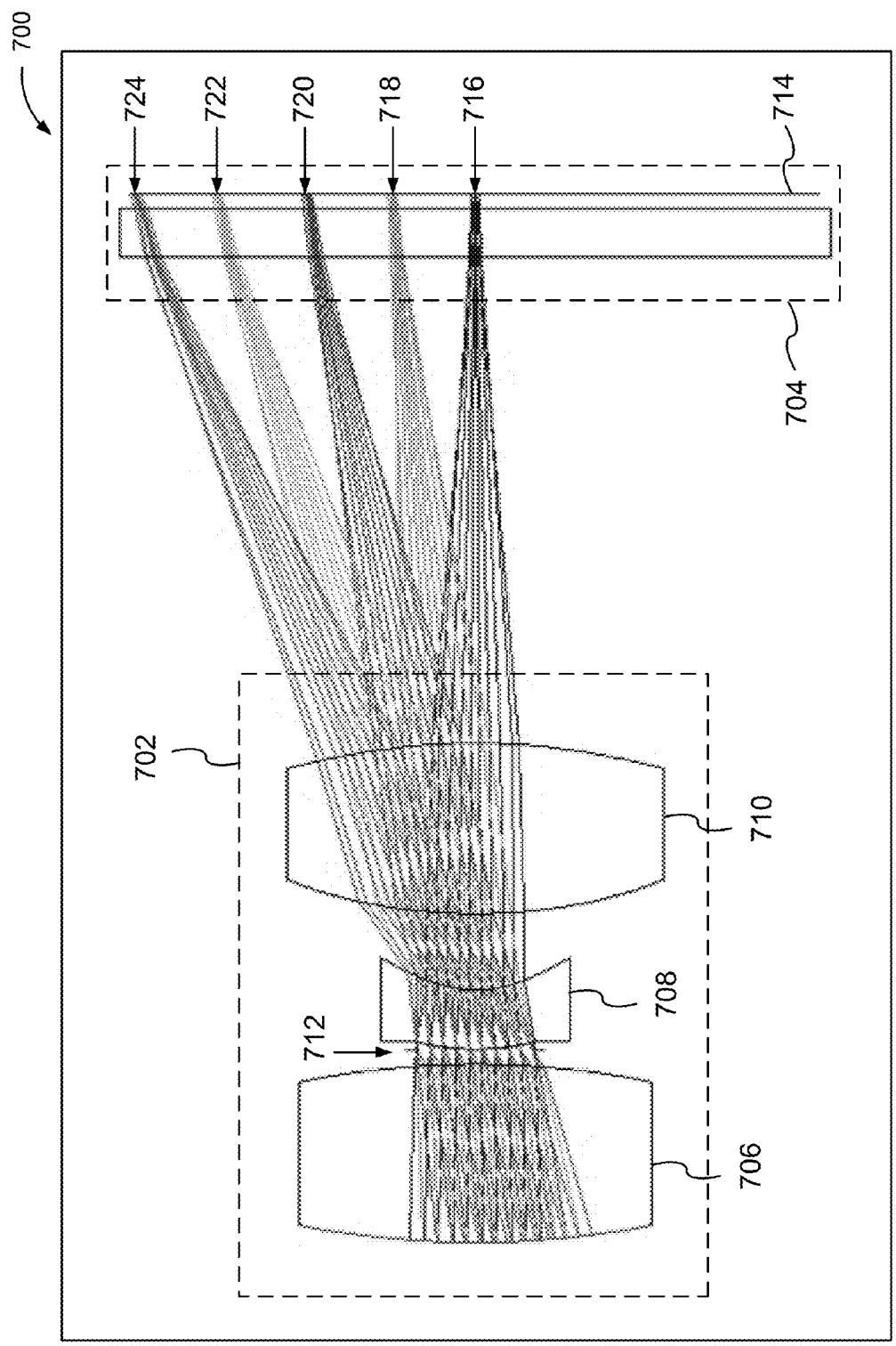
FIG. 7 is a block diagram of an image unit of the reader shown in FIG. 1, according to at least one illustrated embodiment.

FIG. 7 is a block diagram of an imaging unit 700 that includes a spherical aberration lens unit 702 and an image sensor 704, according to one illustrated embodiment. The imaging unit 700 may be used in place of the imaging unit 132 of the reader 100 shown in FIG. 1. The spherical aberration lens unit 702 includes three lenses having a common optical axis (not shown). More particularly, the spherical aberration lens unit 702 includes a first lens 706, a second lens 708, a third lens 710, and a diaphragm 712 disposed between the first lens 706 and the second lens 708. In one embodiment, the total axial length of the lens unit 702 is 8.84625 mm.

The first lens 706 is a biconvex lens, the second lens 708 is a convex-concave lens, and the third lens 710 is a biconvex lens. The first lens 706 focuses light (e.g., that enters the window 112 of the reader 100) onto the convex-side of the second lens 708. The second lens 708 scatters the light received from the first lens 706 onto the third lens 710. The third lens 710 focuses the light received from the second lens 708 onto an image plane 714 of the image sensor 704. The arrangement of the lenses of the lens unit 702 is similar to that of a conventional Cooke Triplet, except that the center lens of a conventional Cooke Triplet reduces spherical aberration blurring and the center lens (i.e., the second lens 708) of the lens unit 702 increases spherical aberration blurring.

Light rays at different sample points of the optical field converge in different regions of the image plane 714. For example, paraxial light rays near the optical axis of the lens unit 702 converge in a region 716 of the image plane 714. Light rays offset by approximately 5 degrees from the optical axis of the lens unit 702 converge in a region 718 of the image plane 714. Light rays offset by approximately 10 degrees from the optical axis of the lens unit 702 converge in a region 720 of the image plane 714. Light rays offset by approximately 15 degrees from the optical axis of the lens unit 702 converge in a region 722 of the image plane 714. Light rays offset by approximately 20 degrees from the optical axis of the lens unit 702 converge in a region 724 of the image plane 714. An image of a barcode symbol that is formed in at least one of the regions 716, 718, 720, 722, and 724 should be in focus and able to be decoded.

Figure 8:
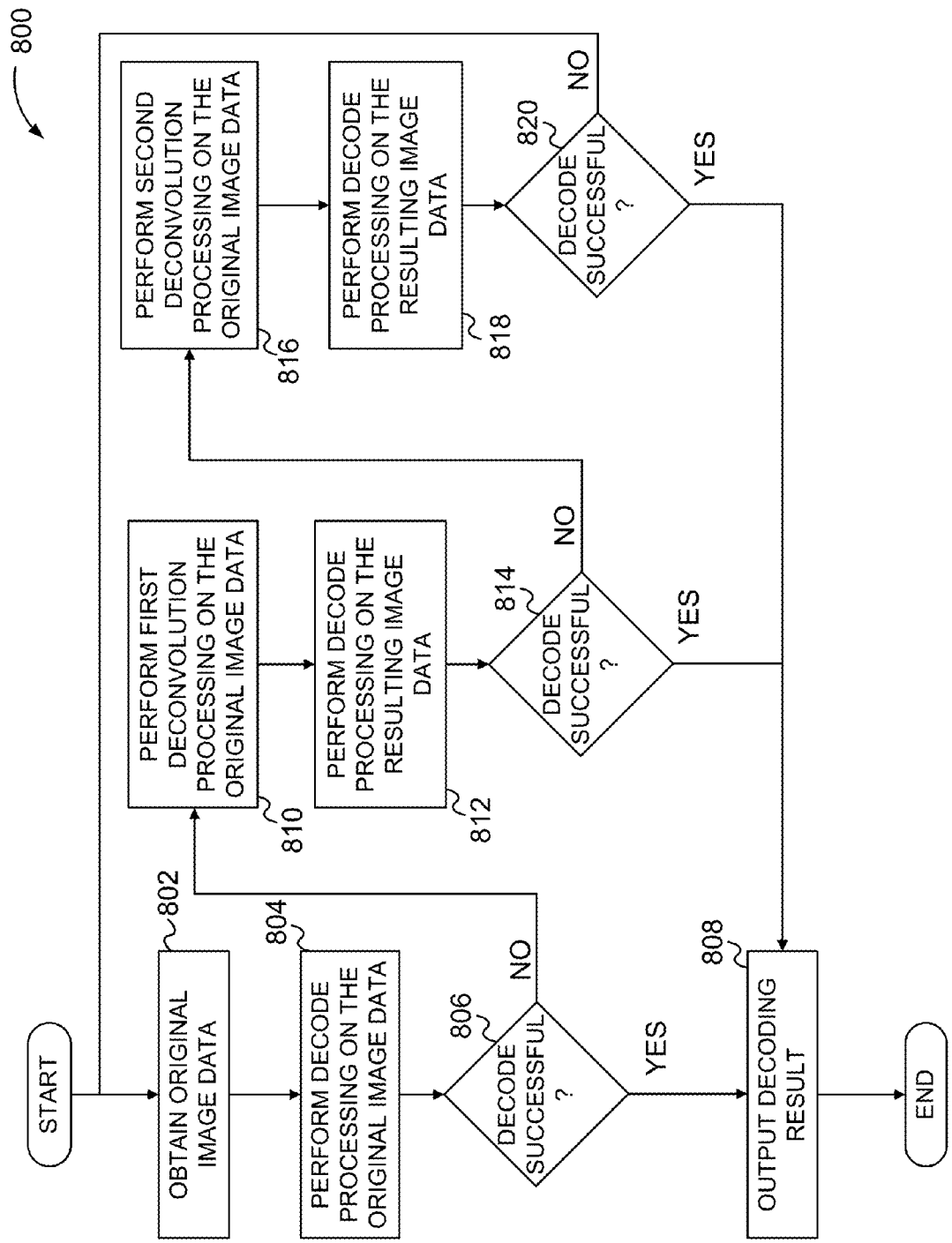
FIG. 8 is a flowchart of a method of decoding optically encoded information, according to at least one illustrated embodiment.

FIG. 8 is a flowchart 800 of a method of decoding optically encoded information that is performed by the reader 100, according to at least one illustrated embodiment. At 802, the optical system 100 obtains original image data corresponding to optically encoded information. For example, in response to the trigger switch 140 being actuated, the microprocessor 114 provides instruction signal(s) to the decoder 116, which cause the decoder 116 to provide instruction signal(s) to the controller 128 of the imager 104. In response, the controller 128 provides instruction signal(s) to the aimer 130, image sensor 136, and the light source 138. As a result, the aimer 130 produces a visible marker, the light source 138 outputs white LED light that is reflected off a barcode symbol, passes through the window 112, and strikes the image sensor 136. The image sensor 136 outputs a file including original image data corresponding to the intensity of light that is incident on the sensor elements of the image sensor 136. The decoder 116 obtains the file including the original image data from the image sensor 136.

At 804, the reader 100 attempts to decode the original image data obtained at 802. The decoder 116 initially may determine a portion of the image data obtained at 802 that corresponds to a barcode symbol. For example, the decoder 116 processes the image data obtained at 802 and identifies a portion of the image data in which a predefined density of transitions between light and dark occur with a predefined frequency. The decoder 116 then performs conventional decode processing on the portion of the original image data obtained at 802 that corresponds to the barcode symbol based on known one-dimensional and two-dimensional symbologies. Examples of such one-dimensional symbologies include: EAN/UPC, GS1 Databar (limited expanded & omni-directional), RSS, Code 39, Code 28, UCC/EAN 128, ISBN, ISBT, Interleaved/Matrix/Industrial and Standard 2 of 5, Codabar, Code 93/93i, Code 11, MSI, Plessey, Telepen, postal codes (Australian Post, BPO, Canada Post, Dutch Post, Japan Post, PostNet, Sweden Post. Examples of such two-dimensional symbologies include: Data Matrix, PDF417, Micro PDF 417, Codablock, Maxicode, QR, Aztec, GS1 composite codes, Direct Part Marking Reading multicodes and barcode symbols on mobile phone screens.

At 806, the reader 100 determines whether the decoding performed at 804 was successful. For example, the decoder 116 evaluates verification data such as a checksum digit, a parity bit, and/or a parity byte included in data that results from the decode processing performed at 804, according to conventional techniques. If the decoder 116 determines the verification data indicates that the decoding performed at 804 was successful, the method proceeds to 808. If the decoder 116 determines the verification data indicates that the decoding performed at 804 was not successful, the method proceeds to 810.

At 808, the reader 100 outputs a decoding result. For example, the decoder 116 provides data corresponding to the optically encoded information to the microprocessor 114, which causes the touch screen 144 to display the data and/or causes the radio 150 or tethered port 152 to transmit the data. Additionally or alternatively, the microprocessor 114 may cause the data corresponding to the optically encoded information to be stored in the flash memory 124.

At 810, the reader 100 performs first deconvolution processing on the original image data. For example, the decoder 116 performs the Wiener filter deconvolution processing described above on the image data obtained at 802 using a one-dimensional deconvolution kernel including data corresponding to the near-field PSF 302 of the lens unit 134.

At 812, the reader 100 attempts to decode the image data resulting from the deconvolution processing performed at 810. For example, the decoder 116 performs the decode processing performed at 804 on the image data resulting from the first deconvolution processing performed at 810.

At 814, the reader 100 determines whether the decoding performed at 812 was successful. For example, the decoder 116 evaluates verification data such as a checksum digit, a parity bit, and/or a parity byte included in data that results from the decode processing performed at 812, according to conventional techniques. If the decoder 116 determines the verification data indicates that the decode processing performed at 812 was successful, the method proceeds to 808. If the decoder 116 determines the verification data indicates that the decoding performed at 812 was not successful, the method proceeds to 816.

At 816, the reader 100 performs second deconvolution processing on the original image data. For example, the decoder 116 performs first Wiener filter deconvolution processing, such as the processing performed at 812. The decoder 116 then performs second Wiener filter deconvolution processing on the data resulting from the first Wiener filter deconvolution processing. Alternatively, the decoder 116 stores the data resulting from the Wiener filter deconvolution processing performed at 812, and performs the second Wiener filter deconvolution processing on that data.

The first Wiener filter deconvolution processing may be performed using a first one-dimensional deconvolution kernel, and the second Wiener filter deconvolution processing may be performed using a second one-dimensional deconvolution kernel. The first one-dimensional deconvolution kernel may be a matrix that includes data corresponding to the near-field PSF 302 of the of the lens unit 134. The second one-dimensional deconvolution kernel may be a matrix that is obtained by rotating the first one-dimensional deconvolution kernel matrix by 90 degrees. That is, the first deconvolution kernel matrix may be orthogonal to the second deconvolution kernel matrix.

At 818, the reader 100 attempts to decode the image data resulting from the second deconvolution processing performed at 816. For example, the decoder 116 performs the decode processing performed at 804 on the image data resulting from the deconvolution processing performed at 816.

At 820, the reader 100 determines whether the decode processing performed at 818 was successful. For example, the decoder 116 evaluates verification data such as a checksum digit, a parity bit, and/or a parity byte included in data that results from the decode processing performed at 818, according to conventional techniques. If the decoder 116 determines the verification data indicates that the decode processing performed at 818 was successful, the method proceeds to 808. If the decoder 116 determines the verification data indicates that the decoding performed at 818 was not successful, the method proceeds to 802 and the method is repeated with newly obtained image data.

Figure 9A:
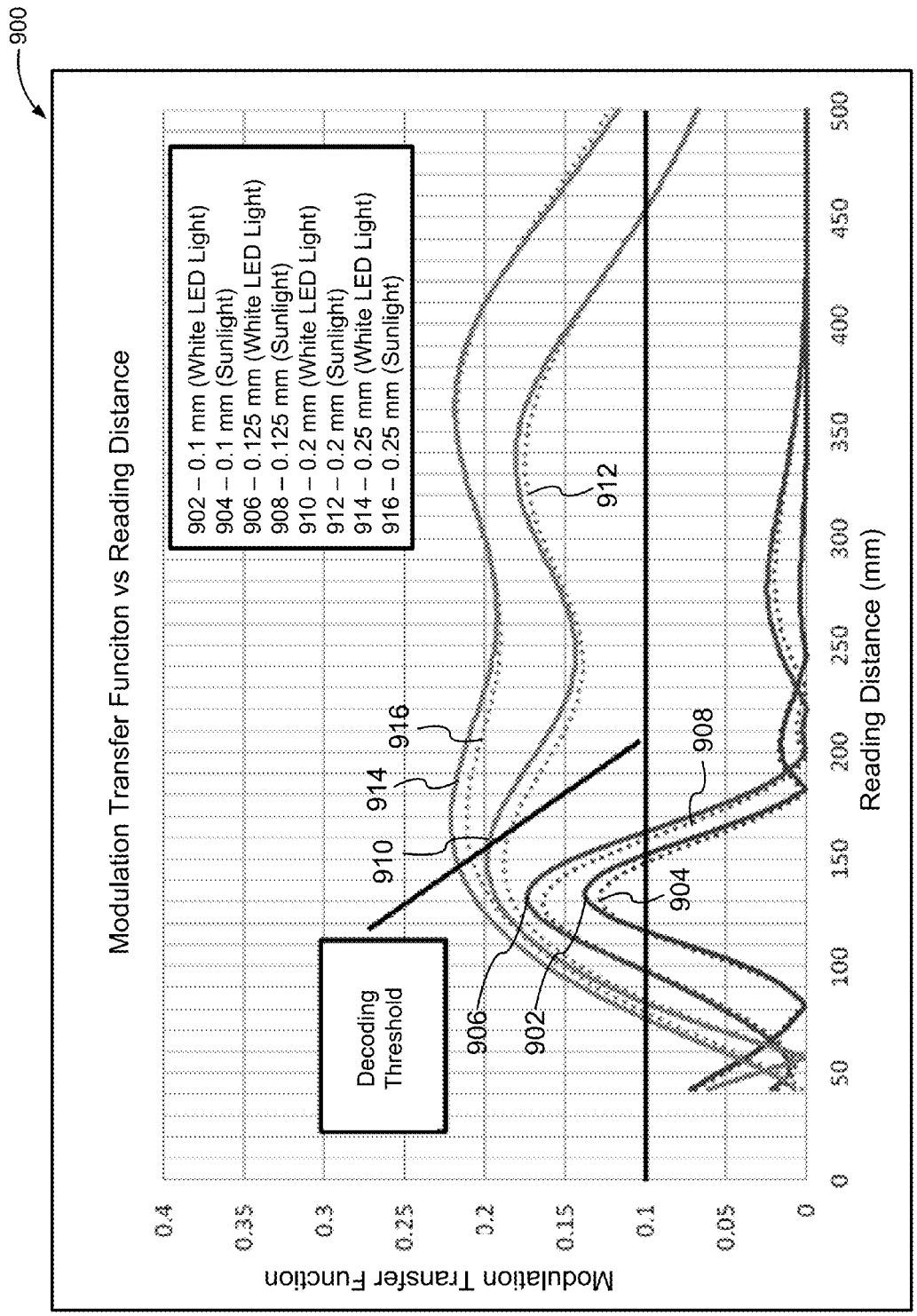
FIG. 9A is a chart showing graphs of modulation transfer functions of the reader shown in FIG. 1, according to at least one illustrated embodiment.

FIG. 9A is a chart 900 including a number of graphs of modulation transfer functions of the reader 100 for various barcode symbol X dimensions. More particularly, the chart 900 includes graphs 902 and 904 showing modulation transfer functions of the reader 100 for a barcode symbol having an X dimension of 0.1 mm (about 4 mils) as imaged in white LED light and in sunlight, respectively. The chart 900 also includes graphs 906 and 908 showing modulation transfer functions of the reader 100 for a barcode symbol having an X dimension of 0.125 mm (about 5 mils) as imaged in white LED light and in sunlight, respectively. Additionally, the chart 900 includes graphs 910 and 912 showing modulation transfer functions of the reader 100 for a barcode symbol having an X dimension of 0.2 mm (about 8 mils) as imaged in white LED light and in sunlight, respectively. The chart 900 also includes graphs 914 and 916 showing modulation transfer functions of the reader 100 for a barcode symbol having an X dimension of 0.25 mm (about 10 mils) as imaged in white LED light and in sunlight, respectively.

Figure 9B:
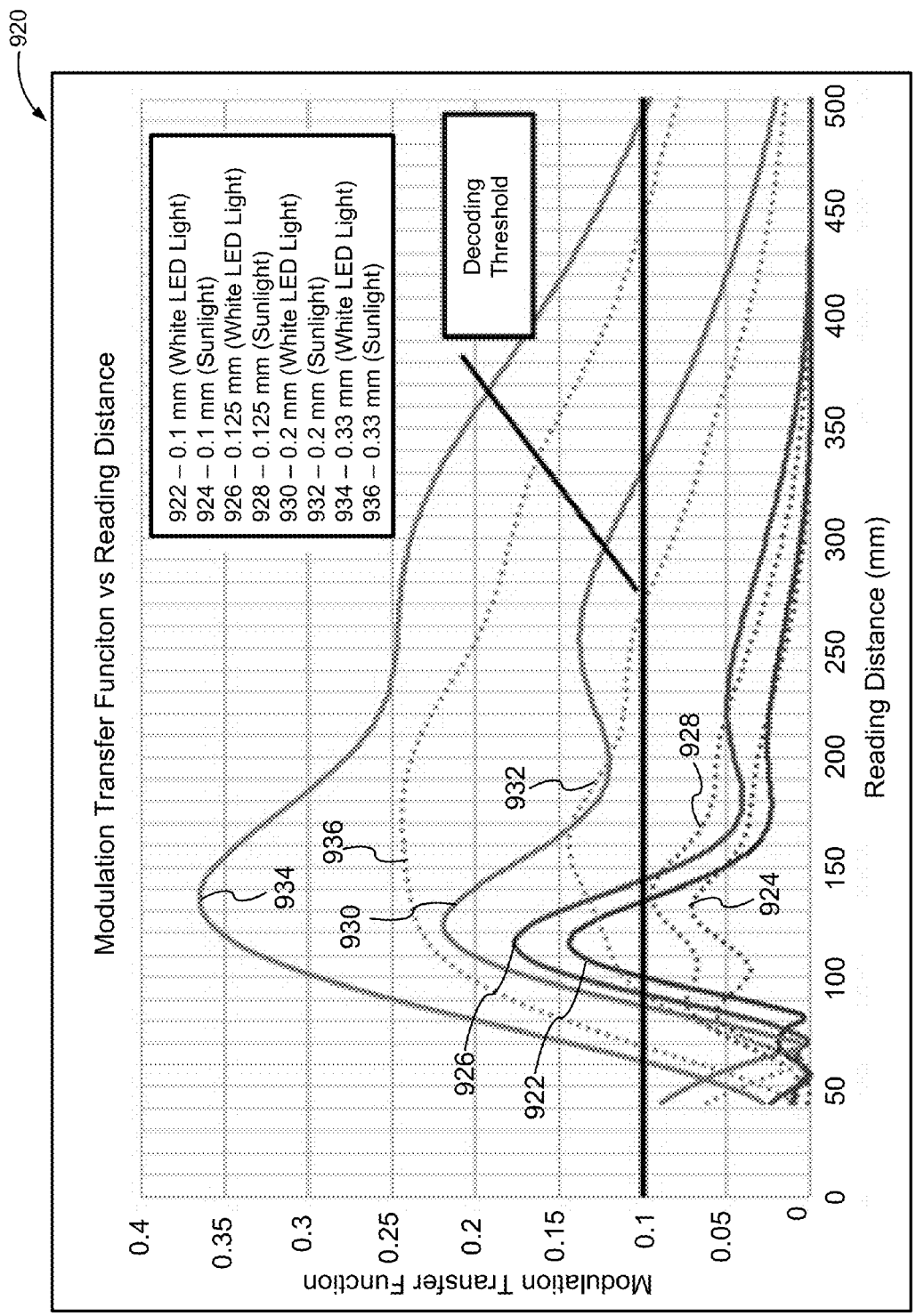
FIG. 9B is a chart showing graphs of modulation transfer functions of a prior art reader.

FIG. 9B is a chart 920 including a number of graphs of modulation transfer functions of a prior art reader. More particularly, the chart 920 includes graphs 922 and 924 showing modulation transfer functions of the prior art reader for a barcode symbol having an X dimension of 0.1 mm (about 4 mils) as imaged in white LED light and in sunlight, respectively. The chart 920 also includes graphs 926 and 928 showing modulation transfer functions of the prior art reader for a barcode symbol having an X dimension of 0.125 mm (about 5 mils) as imaged in white LED light and in sunlight, respectively. Additionally, the chart 920 includes graphs 930 and 932 showing modulation transfer functions of the prior art reader for a barcode symbol having an X dimension of 0.2 mm (about 8 mils) as imaged in white LED light and in sunlight, respectively. The chart 920 also includes graphs 934 and 936 showing modulation transfer functions of the prior art reader for a barcode symbol having an X dimension of 0.33 mm (about 13 mils) as imaged in white LED light and in sunlight, respectively.

When the prior art reader operates in sunlight and with white LED light, decoding of barcode symbols with X dimensions that are less than 6 mils is not possible. For barcode symbols with larger X-dimension, the prior art reader exhibit substantially reduced DOF (about half) as the reader 100. For example, as shown by the graph 932 in FIG. 9B, a barcode symbol having an X dimension of 0.2 mm that is imaged in sunlight by the prior art reader cannot be decoded at reading distances greater than approximately 260 mm. However, as shown by the graph 912 in FIG. 9A, a barcode symbol having an X dimension of 0.2 mm that is imaged in sunlight by the reader 100 can be decoded at reading distances up to approximately 450 mm. Additionally, the reader 100 has substantially improved performance in sunlight for all X-dimensions compared to the prior art imaging system, as illustrated by the graphs shown with dotted lines in FIGS. 9A and 9B.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of decoding optically encoded information performed by an image processing system, the method comprising:
obtaining first image data corresponding to an image of optically encoded information received via a lens unit that causes controlled spherical aberration;
performing first processing on the first image data;
responsive to the first processing on the first image data not producing data corresponding to the optically encoded information, obtaining second image data by performing second processing on the first image data and performing the first processing on the second image data; and responsive to the first processing on the second image data not producing the data corresponding to the optically encoded information, obtaining third image data by performing third processing on the first image data and performing the first processing on the third image data;

wherein the lens unit causes predetermined spherical aberration blurring in the image of the optically encoded information.

2. The method of claim 1 wherein the second processing includes deconvolution processing.

3. The method of claim 1 wherein the second processing includes Weiner filter deconvolution processing.

4. The method of claim 3 wherein the Weiner filter deconvolution processing is performed using data corresponding to a point spread function of the lens unit.

5. The method of claim 3 wherein the Weiner filter deconvolution processing is performed using data corresponding to a near-field point spread function of the lens unit.

6. The method of claim 3 wherein the Weiner filter deconvolution processing is performed using a one-dimensional deconvolution kernel.

7. The method of claim 1 wherein the third processing includes deconvolution processing.

8. The method of claim 1 wherein the third processing includes Weiner filter deconvolution processing.

9. The method of claim 8 wherein the Weiner filter deconvolution processing is performed using data corresponding to a point spread function of the lens unit.

10. The method of claim 8 wherein the Weiner filter deconvolution processing is performed using data corresponding to a near-field point spread function of the lens unit.

11. The method of claim 8 wherein the Weiner filter deconvolution processing is performed using two one-dimensional deconvolution kernels.

12. The method of claim 8 wherein the Weiner filter deconvolution processing is performed using a first deconvolution kernel matrix and a second deconvolution kernel matrix that is orthogonal to the first deconvolution kernel matrix.

13. The method of claim 12 wherein the second deconvolution kernel matrix corresponds to the first deconvolution kernel matrix rotated by ninety degrees.

14. The method of claim 1 wherein the optically encoded information includes a one-dimensional barcode symbol.

15. The method of claim 1 wherein the optically encoded information includes a two-dimensional machine-readable symbol.

16. The method of claim 1 wherein the lens unit causes more near-field spherical aberration blurring than far-field spherical aberration blurring.

17. The method of claim 1 wherein the lens unit produces spherical aberration blurring such that offsetting fifth order effects are added to third order solutions to a spherical aberration equation.

18. The method of claim 1, further comprising:
outputting the data corresponding to the optically encoded information.

19. An image processing system, the method comprising:
one or more processors; and
one or more processor-readable storage media storing processor-executable instructions that, when executed by the one or more processors, causes the one or more processors to:

obtain first image data corresponding to an image of optically encoded information received via a lens unit that causes controlled spherical aberration;

perform first processing on the first image data;

responsive to the first processing on the first image data not producing data corresponding to the optically encoded information, perform second processing on the first image data to obtain second image data and perform the first processing on the second image data; and responsive to the first processing on the second image data not producing the data corresponding to the optically encoded information, perform third processing on the first image data to obtain third image data and perform the first processing on the third image data;

wherein the lens unit causes predetermined spherical aberration blurring in the image of the optically encoded information.

20. The image processing system of claim 19 wherein the second processing includes deconvolution processing.

21. The image processing system of claim 19 wherein the second processing includes Weiner filter deconvolution processing.

22. The image processing system of claim 21 wherein the Weiner filter deconvolution processing is performed using data corresponding to a point spread function of the lens unit.

23. The image processing system of claim 21 wherein the Weiner filter deconvolution processing is performed using data corresponding to a near-field point spread function of the lens unit.

24. The image processing system of claim 21 wherein the Weiner filter deconvolution processing is performed using a one-dimensional deconvolution kernel.

25. The image processing system of claim 19 wherein the third processing includes deconvolution processing.

26. The image processing system of claim 19 wherein the third processing includes Weiner filter deconvolution processing.

27. The image processing system of claim 26 wherein the Weiner filter deconvolution processing is performed using data corresponding to a point spread function of the lens unit.

28. The image processing system of claim 27 wherein the Weiner filter deconvolution processing is performed using data corresponding to a near-field point spread function of the lens unit.

29. The image processing system of claim 27 wherein the Weiner filter deconvolution processing is performed using two one-dimensional deconvolution kernels.

30. The image processing system of claim 27 wherein the Weiner filter deconvolution processing is performed using a first deconvolution kernel matrix and a second deconvolution kernel matrix that is orthogonal to the first deconvolution kernel matrix.

31. The image processing system of claim 30 wherein the second deconvolution kernel matrix corresponds to the first deconvolution kernel matrix rotated by ninety degrees.

32. The image processing system of claim 19 wherein the optically encoded information includes a one-dimensional barcode symbol.

33. The image processing system of claim 19 wherein the optically encoded information includes a two-dimensional machine-readable symbol.

34. The image processing system of claim 19 wherein the lens unit causes more near-field spherical aberration blurring than far-field spherical aberration blurring.

35. The image processing system of claim 19, further comprising:
the lens unit.

36. The image processing system of claim 19 wherein the lens unit produces spherical aberration blurring such that offsetting fifth order effects are added to third order solutions to a spherical aberration equation.

37. An imager, comprising:
a lens unit that produces predetermined spherical aberration blurring, the lens unit producing spherical aberration blurring such that offsetting fifth order effects are added to the third order solutions to a spherical aberration equation; and
an image sensor that obtains images through the lens unit and produces corresponding image data.

38. The imager of claim 37 wherein the lens unit includes a first lens, a second lens, a third lens, and a diaphragm disposed between the first lens and the second lens.

39. The imager of claim 38 wherein the first lens is a biconvex lens, the second lens is a convex-concave lens, and the third lens is a biconvex lens.

40. The imager of claim 39, further comprising:
an aimer that produces a visible marker.

41. The imager of claim 40, further comprising:
a light source that produces light.

42. The imager of claim 41, further comprising:
a controller that controls operation of the image sensor, the aimer, and the light source.

43. The imager of claim 37 wherein respective points of an optical field entering the lens unit that are offset by respective angles from an optical axis of the lens unit converge in respective regions of an image plane of the image sensor.

44. An imager, comprising:
a lens unit that produces predetermined spherical aberration blurring, the lens unit producing spherical aberration blurring with third order solutions to a spherical aberration equation;
an image sensor that obtains images through the lens unit and produces corresponding image data;
and one or more processors; and
one or more processor-readable storage media storing processor-executable instructions that, when executed by the one or more processors, cause the one or more processors to:
obtain first image data corresponding to an image of optically encoded information received via the lens unit;
perform first processing on the first image data;
responsive to the first processing on the first image data not producing data corresponding to the optically encoded information, perform second processing on
the first image data to obtain second image data and perform the first processing on the
second image data.

45. The imager of claim 44 wherein the lens unit includes a first lens, a second lens, a third lens, and a diaphragm disposed between the first lens and the second lens.

46. The imager of claim 45 wherein the first lens is a biconvex lens, the second lens is a convex-concave lens, and the third lens is a biconvex lens.

47. The imager of claim 46, further comprising:
an aimer that produces a visible marker.

48. The imager of claim 47, further comprising:
a light source that produces light.

49. The imager of claim 48, further comprising:
a controller that controls operation of the image sensor, the aimer, and the light source.

50. The imager of claim 49 wherein respective points of an optical field entering the lens unit that are offset by respective angles from an optical axis of the lens unit converge in respective regions of an image plane of the image sensor.

* * * * *